(12) United States Patent  
Carver (10) Patent No.: US 8,174,245 B2
(45) Date of Patent: May 8, 2012

(54) DEVICE AND METHOD FOR CONVERTING THERMAL ENERGY INTO ELECTRICAL ENERGY

(76) Inventor: David Reginald Carver, Colorado Springs, CA (US)

(*) Notice: Subject to any disclaimer, the term of this patent is extended or adjusted under 35 U.S.C. 154(b) by 48 days.

(21) Appl. No.: 12/884,509

(22) Filed: Sep. 17, 2010

(65) Prior Publication Data

US 2011/0001389 A1  Jan. 6, 2011

Related U.S. Application Data

(62) Division of application No. 12/134,374, filed on Jun. 6, 2008, now Pat. No. 7,816,601.

(60) Provisional application No. 60/933,815, filed on Jun. 8, 2007.

(51) Int. Cl.
*F25B 21/00* (2006.01)
*H02N 11/00* (2006.01)
*H02N 10/00* (2006.01)
*H01L 35/00* (2006.01)

(52) U.S. Cl. ............. 322/2 R; 310/306; 62/3.1; 136/201

(58) Field of Classification Search .................. 322/2 R; 310/306; 62/3.1; 318/117; 136/201
See application file for complete search history.

(56) References Cited

U.S. PATENT DOCUMENTS

| | | | | |
|---|---|---|---|---|
| 4,916,907 A | * | 4/1990 | Munk et al. | 62/3.1 |
| 5,945,767 A | * | 8/1999 | Westlund | 310/306 |
| 6,588,216 B1 | * | 7/2003 | Ghoshal | 62/3.1 |
| 6,959,555 B2 | * | 11/2005 | Bell | 62/3.7 |

FOREIGN PATENT DOCUMENTS

| | | | |
|---|---|---|---|
| JP | 2002-118295 | * | 4/2002 |
| JP | 2005-108866 | * | 4/2005 |

* cited by examiner

*Primary Examiner* — Burton Mullins (57) ABSTRACT

A device and method for using a field-responsive material that changes temperature when subjected to a respective field in combination with a thermal to electrical energy converter to accomplish the generation of electrical energy. The field-responsive material, such as an electrocaloric or magnetocaloric material, changes temperature when subjected to a change in a respective electric or magnetic field. The changing field applied to the field-responsive material causes a temperature change in the field-responsive material to heat or cool the field-responsive material. A thermal to electrical energy converter is in thermal contact with the field-responsive material, such that temperature changes in the field-responsive material in turn changes the temperature of the thermal to electrical energy converter, which the converter then converts into electrical energy. In this manner, the application of an appropriate electric or magnetic field can be utilized to generate thermal energy changes that can be converted into electrical energy.

11 Claims, 6 Drawing Sheets

DEVICE AND METHOD FOR CONVERTING THERMAL ENERGY INTO ELECTRICAL ENERGY

RELATED APPLICATION

The application is a divisional of U.S. patent application Ser. No. 12/134,374, filed on Jun. 6, 2008, now U.S. Pat. No. 7,816,601 entitled, "Device and Method for Converting Thermal Energy Into Electrical Energy," which claims the benefit of and priority to U.S. Provisional Application Ser. No. 60/933,815, entitled "Apparatus and Method for Generating Energy," filed Jun. 8, 2007, the contents of each of which are incorporated by reference herein in their entireties.

BACKGROUND

This disclosure relates to converting thermal energy to electrical energy, and more particularly to the use of time-varying electrical and/or magnetic fields in the conversion of thermal energy to electrical energy.

Many prior attempts of converting thermal energy to electrical energy have resulted in very poor efficiencies in energy conversion, oftentimes as low as 1 to 5% conversion efficiency. Further, many prior attempts of converting thermal energy to electrical energy have required high voltage operation. These and other deficiencies have previously minimized the usefulness of attempting to convert thermal energy into electrical energy.

SUMMARY

According to one or more embodiments of the present disclosure, a device and method are provided for using a field-responsive material that changes temperature when subjected to a respective field in combination with a thermal to electrical energy conversion component to accomplish the generation of electrical energy. The device includes a field-responsive material that changes temperature when subjected to a respective field, such as an electrocaloric material that changes temperature when subjected to a change in electrical field and/or an magnetocaloric material that changes temperature when subjected to a change in magnetic field. An appropriate field is applied to the field-responsive material so as to cause a temperature change in the field-responsive material to heat the field-responsive material. The device further includes a thermal to electrical energy conversion component in thermal contact with the field-responsive material, such that the heat generated in the field-responsive material in turn heats the thermal to electrical energy conversion component. The thermal to electrical energy conversion component then converts heat into electrical energy. In this manner, the application of an appropriate electric or magnetic field can be utilized to generate thermal energy (i.e., heat) that can be converted into electrical energy.

In one or more embodiments, the thermal to electrical energy converting device and method includes a field generator for applying a time-varying alternating field on the field-responsive material having "on" periods and "off" periods. During "on" periods when the field-responsive material is subjected to the appropriate field, heat is generated in the thermal to electrical energy conversion component through the field-responsive material and eventually converted into electrical energy. It is the change in temperature that the thermal to electrical energy converting device uses to generate energy. After the thermal energy has sufficiently been converted into the electrical energy, the field is removed from the field-responsive material during an "off" period to allow all of the components to return toward their equilibrium temperatures. The field generator then continuously applies a time-varying alternating field on the field-responsive material to cyclically heat the components of the device to generate electrical energy every time the components are heated. In one or more embodiments, the thermal to electrical energy converting device and method can thus produce energy in the form of an AC electrical current that can be stored by an energy capture component that captures electrical flow from the thermal to electrical energy conversion component.

In one or more embodiments, the thermal to electrical energy converting device and method includes an electrocaloric device used in combination with a thermal to electrical energy converting device formed in a stacked relationship. The electrocaloric device includes a layer of electrocaloric material positioned between a pair of plate electrodes, where the plate electrodes are connected to the field generator for subjecting the electrocaloric material to an alternating electric field. The thermal to electrical energy converting device is positioned adjacent to and in thermal contact with the electrocaloric device in a stacked relationship. A target substrate is positioned adjacent to and in thermal contact with thermal to electrical energy converting device to provide heat flow into the device. The thermal to electrical energy converting device may comprise a device exhibiting thermocouple or Seebeck effects, Peltier effects, Thomson effects and/or pyroelectricity effects. Electrical connections are connected to respective portions of the thermal to electrical energy converting device so as to capture the electrical flow from the thermal to electrical energy converting device and pass it on to an energy capturing component.

In one or more embodiments, the thermal to electrical energy converting device and method includes an magnetocaloric device used in combination with a thermal to electrical energy converting device. In one or more embodiments, the magnetocaloric device and thermal to electrical energy converting device are formed to possess tubular or circular portions in order to advantageously form strong magnetic fields with a solenoid type of coil, where the tubular thermal to electrical energy converting device is surrounded by a tubular magnetocaloric device. A layer of magnetocaloric material is formed to surround the tubular thermal to electrical energy converting device, and windings of an electrical wire (e.g., solenoid) or printed circuit are formed around the layer of magnetocaloric material and further connected to the field generator for subjecting the magnetocaloric material to an alternating magnetic field field. The magnetic field is varied in a time dependent manner to provide "pulses" of thermal differentials to the thermal to electrical energy converting device, which are in turn converted into electrical energy. Electrical connections are connected to respective portions of the thermal to electrical energy converting device so as to capture the electrical flow from the thermal to electrical energy converting device and collect it in an energy capturing component.

DRAWINGS

The above-mentioned features and objects of the present disclosure will become more apparent with reference to the following description taken in conjunction with the accompanying drawings wherein like reference numerals denote like elements and in which.

DETAILED DESCRIPTION

Embodiments described herein are directed to a thermal to electrical energy converting device and method for using a field-responsive material that changes temperature when subjected to a respective field in combination with a thermal to electrical energy conversion component to accomplish the generation of electrical energy.

Figure 1:
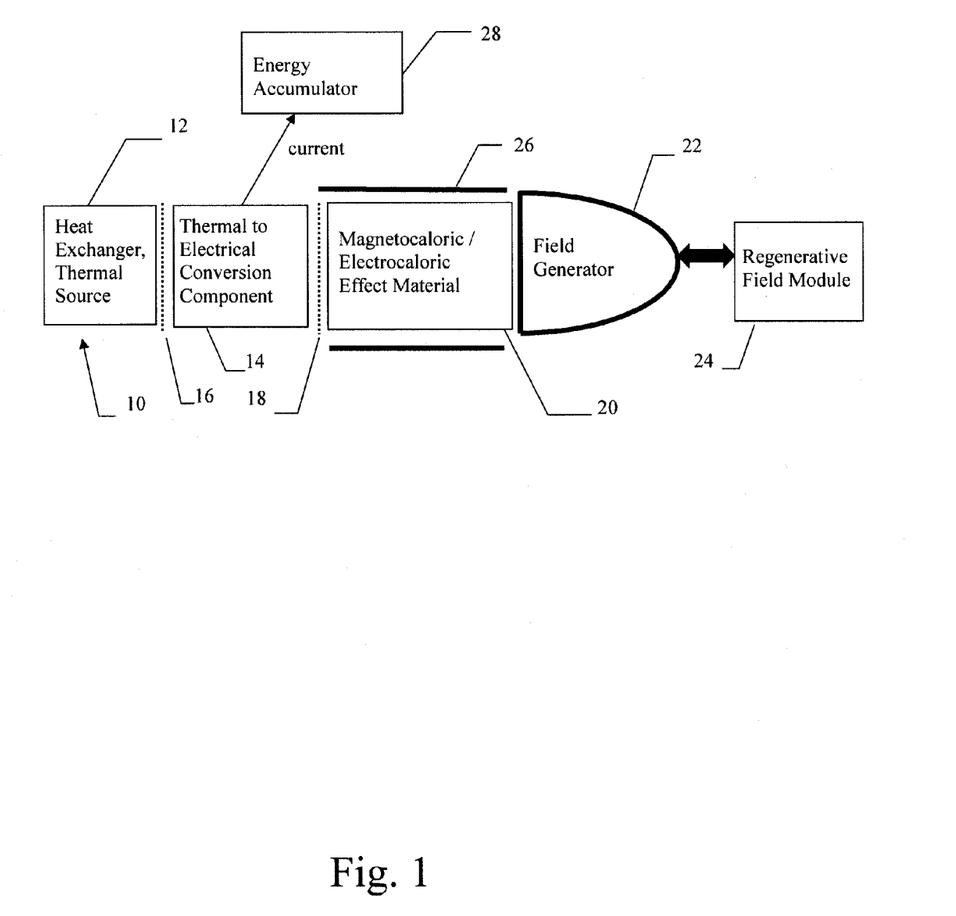
FIG. 1 illustrates a schematic block diagram of a thermal to electrical energy converting device formed in accordance with one or more embodiments of the present disclosure.

According to one or more embodiments, as illustrated by the block schematic illustration of FIG. 1, a thermal to electrical energy converting device 10 is provided that includes a heat exchanger thermal source 12, a thermal to electrical conversion component 14, a field-responsive material 20, a field generator 22, a regenerative field module 24, and an energy accumulator 28. The field-responsive material 20 comprises of a material exhibiting either an electrocaloric effect (ECE) when subjected to an electric field or an magnetocaloric effect (MCE) when subjected to a magnetic field. Since, in the discussion to follow, the result of the overall process will be the same if the material either heats or cools, the effects will simply be referred to as electrocaloric effects (ECE) or magnetocaloric effects (MCE) with heating. The ECE and MCE can be characterized as either a heating or a cooling of the material 20's temperature. In the case of an MCE material 20, an immersion into a magnetic field will produce a heating effect in the material 20. To a material 20 that is already in a magnetic field, when the magnetic field is removed, the material 20 will cool. In the case of an ECE material 20, when an electric field is established, the material 20 will rise in temperature. Upon removal of the electric field, the material 20 will cool.

In one or more embodiments, the thermal to electrical energy conversion component 14 may comprise at least one of any number of devices that produce an electric voltage and subsequent current from the application of heat or the change in heat from one portion of the component 14 to another. Representative devices and materials that may be utilized for the thermal to electrical energy conversion component 14 includes those devices that exhibit: (1) the thermocouple or Seebeck effect, (2) the Peltier effect, (3) the Thomson effect, and/or (4) the Pyroelectricity effect. Devices that rely upon the "thermocouple effect" include those exhibiting the Seebeck and Peltier effects. The Seebeck effect is the electrical current and voltage produced when two dissimilar conductors are placed in contact with each other when maintained at different temperatures. The Thomson effect is the current produced when a single conductor has a temperature differential maintained along its length. The Pyroelectricity effect is the voltage and current that is generated by a material, such as polyvinylidenefluoride, when heated. While many of the embodiments described herein that follow will make reference to the thermal to electrical energy conversion component 14 utilizing materials exhibiting the Seebeck and Thomson effects, it is understood that any material exhibiting any of the above-listed thermal to electric energy conversion effects could be utilized alone or in combination in any of the embodiments.

The heat exchanger thermal source 12 is a thermal source of heat for device 10 and may comprise the ambient environment, a heat source, or even alternatively a cooler heat exchanger source than the rest of the materials. The heat exchanger thermal source 12 is positioned adjacent to and in thermal contact with the thermal to electrical energy conversion component 14 through a heat transfer area 16, which is desired to be as heat conductive as possible without necessarily being electrically conductive. On the opposite side of the electrical energy conversion component 14, the field-responsive material 20 (i.e., MCE or ECE material) is further positioned adjacent to and in thermal contact with the thermal to electrical energy conversion component 14 through a heat transfer area 18.

A field generator 22, such as a magnetic field generator or electric field generator, is arranged so as to be able to apply an appropriate field to the field-responsive material 20 so as to cause a temperature change in the field-responsive material 20 to heat or cool the field-responsive material 20. For example, the field generator 22 may comprise a dual primary AC transformer that outputs a "flyback" AC signal at 5 to 50 KHz with an AC output of 1 to 50 mA and 1 to 5 KV. The field generator 22 may include elements 26, which may comprise a solenoid in the case of one type of common magnetic field generator that is situated such that its strongest magnetic field volume will encompass the field-responsive material 20 in part or totally or may comprise alternatively substantially parallel plates in the case of one type of common electric field generator situated such that the field between the plates is mostly if not entirely covering the field-responsive material 20. A regenerative field module 24 is arranged with respect to the field generator 22 to supply energy for recirculation current, as well known to those skilled in the art. For example, regenerative field module 24 may comprise a current controller such as a current mode PWM controller known to those skilled in the art. In the case of a applying a magnetic field, the energy for a recirculation current may be stored in the magnetic field of an inductor serving as the regenerative field module 24. In the case of applying an electric field, the energy to form the field can be stored in an inductor or a capacitor serving as the regenerative field module 24. An energy accumulator 28 or energy capturing component may further be arranged to receive and store the electrical energy generated by the thermal to electrical energy conversion component 14. The energy accumulator 28 may comprise any type of circuit or module capable of accumulating electrical energy. In one or more embodiments in which the thermal to electrical energy conversion component 14 is a Peltier or thermocouple heater/cooler, a small temperature difference results in a current flow from the component 14 at a relatively low voltage. The energy in this current can be "captured" by a transformer and utilized in a variety of methods that are well known to those skilled in the art. In its simplest form, the energy accumulator 28 could further be simply a load resistor to measure the output of the thermal to electrical energy conversion component 14.

A representative description of the operation of the device of FIG. 1 will be set forth by way of example. The field generator 22 in conjunction with either a respective solenoid or capacitive plates 26 will create a field (a magnetic field in the case of a field responsive material 20 being a MCE material or an electric field in the case of it being an ECE material 20) around the field-responsive material 20 to produce a heating effect in the field-responsive material 20. The regenerative field module 24 creates a current into the elements 26, i.e. solenoid or capacitive plates as the case may be, such that a rise in temperature occurs in the field-responsive material 20 and, in turn, the thermal to electrical energy conversion component 14. The temperature at the heat transfer area 18 is now increased by such heating and heat flow into the thermal to electrical energy conversion component 14 thus occurs. Due to the newly formed temperature differential at the heat transfer area 18, there is an electrical current flow out of the thermal to electrical energy conversion component 14 into the energy accumulator 28. The flow of current out of the thermal to electrical energy conversion component 14 causes the temperature of the heat transfer area 16 to maintain at an equilibrium or actually fall somewhat as it flows into the energy accumulator 28. As the current starts to fall from the thermal to electrical energy conversion component 14, the field applied by the field generator 22 is allowed to collapse, and the energy in the field is stored or moved to another device for later use by the regenerative field module 24. As the field is removed from the field-responsive material 20 the material cools to a temperature that is less than its original temperature. Heat flow through the thermal to electrical energy conversion component 14 from the heat exchanger thermal source 12 is allowed to bring the field-responsive material 20 up to a "warmer" temperature that approaches its original temperature. The residual heat that was not "converted" into current in the thermal to electrical energy conversion component 14 also adds to this heat. But, since some of the energy in the thermal to electrical energy conversion component 14 has been removed in the form of electrical energy, this amount of heat is less than what was originally put into the thermal to electrical energy conversion component 14 from 20. So, overall, there is heat flow from the heat exchanger thermal source 12 into the thermal to electrical energy conversion component 14 (and subsequently into the field-responsive material 20). When the temperature of the field-responsive material 20 has risen sufficiently, the process is started over again by reapplying the field to the field-responsive material 20. The repeated reapplication of the field in alternating "on" and "off" periods allows thermal "pulses" in the device 10 to be generated that are converted into electrical energy in an efficient conversion.

In one or more embodiments, the thermal to electrical energy converting method includes a field generator 22 for applying a time-varying alternating field on the field-responsive material 20 using a modulation component to allow time variant field variations to be generated. The time-varying alternating field is applied to a field-responsive material 20 that changes temperature in response to a change in the field strength it is subjected to. A heat differential to electricity converter that is in thermal contact with the field-responsive material 20 creates electrical energy from the changing temperature, and an energy capture component subsequently captures the electrical flow from the heat differential to electricity converter and allows a net transfer of energy from heat to electricity to be generated.

In one or more embodiments, the heat transfer characteristics of the device 10 are optimal when the device 10 is made relatively thin (i.e., approximately 80 micrometers), and the rate determining step for the overall electrical energy production of the device 10 is determined by the temperature differential developed at field-responsive material 20 and the efficiency of the heat transfer across the boundary 18 between the field-responsive material 20 and the thermal to electrical energy conversion component 14. In one or more embodiments, it is further advantageous to operate the device 10 in such a manner that the operating frequency of the field generator 22 is as low as possible to minimize the losses in the device 10 due to extraneous non-ideal losses from modulation of the fields. In one or more embodiments, the energy capture component 28 is operated at such currents and voltages that are commonly found in typical electronic circuits which use intrinsically safe voltages and currents.

Electrocaloric Devices Employing Electrocaloric Effects

In one or more embodiments, a thermal to electrical energy converting device is provided including at least one Electrocaloric device employing an ECE material. An electrocaloric material is utilized that displays (typically) an increase in temperature when the material is subjected to an electric field. Due to the nature of the electric field, the strongest fields can be produced when plate electrodes situated in parallel and close together are utilized to generate the electric field. As such, in one or more embodiments, the ECE thermal to electrical energy converting device is very well suited for planar type of arrangements with the elements of the device arranged in planes and "stacked" on one another for efficient heat transfer. In one or more embodiments, the layers are made very thin (i.e. 1 to 2 microns in thickness) for rapid heat transfer to and from the environment.

Figure 2:
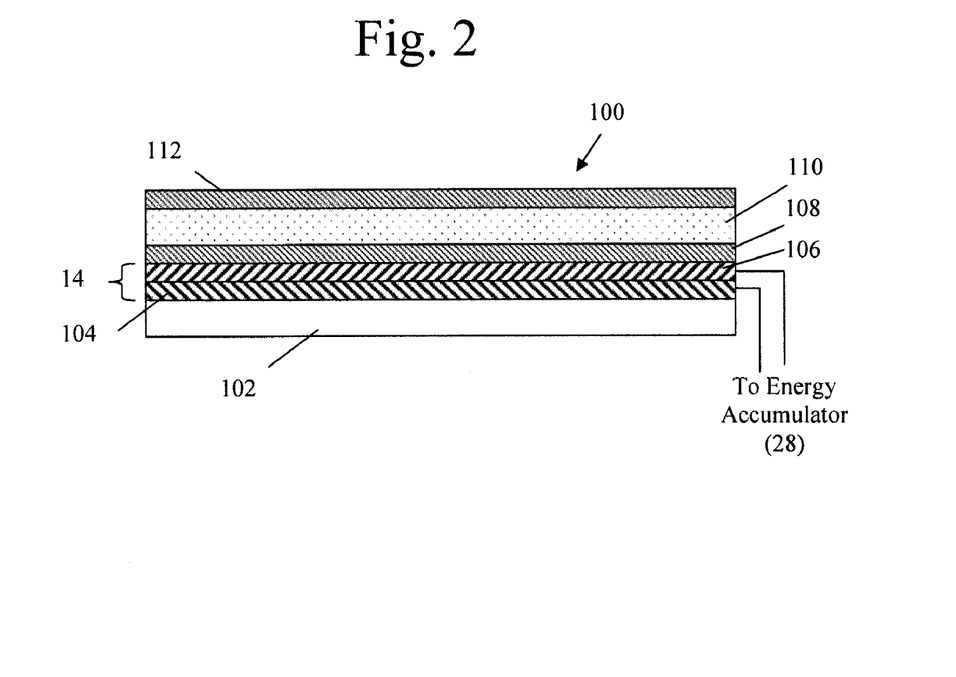
FIG. 2 illustrates a cross-sectional view of a thermal to electrical energy converting device exhibiting electrocaloric effects formed in accordance with one or more embodiments of the present disclosure.

Referring now to FIG. 2, a cross-sectional view of one example of an ECE thermal to electrical energy converting device 100 is illustrated in accordance with one or more embodiments. The device 100 is formed in a stacked arrangement with a target substrate 102 serving as the heat exchanger thermal source 12, where the target substrate 102 is either a thermally conductive material or a thin insulated material that is formed on a thermally conductive surface. The target substrate 102 serves as the source for where the heat flow comes into the device 100. The thermal to electrical energy conversion component 14 comprises a thermocouple including a first electrode layer 104 and a second electrode layer 106. A highly conductive metal layer 108 is formed over the second electrode layer 106, wherein an insulation layer (not shown) may optionally be formed between the metal layer 108 and the second electrode layer 106. A layer of ECE material 110 serving as field-responsive material 20 is formed over the metal layer 108, and a second highly conductive metal layer 112 is formed over the layer of ECE material 110. Metal layers 108 and 112 are connected to the field generator 22 and serve as capacitor plates 26 for subjecting the layer of ECE material 110 to a time-varying electric field.

Figure 3:
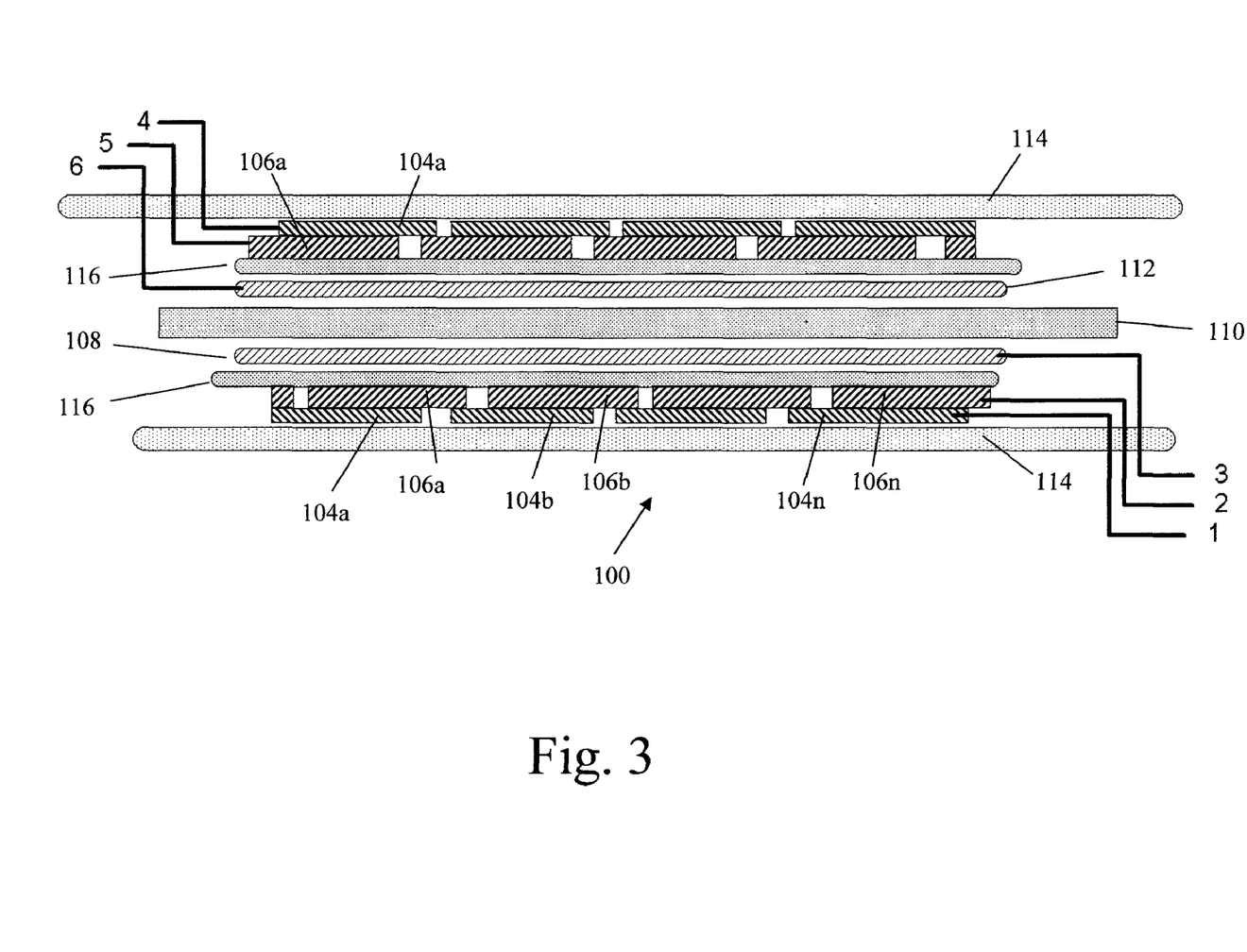
FIG. 3 illustrates a cross-sectional view of a thermal to electrical energy converting device exhibiting electrocaloric effects formed in accordance with one or more embodiments of the present disclosure.

In one or more embodiments, the ECE thermal to electrical energy converting device 100 may include multiple thermocouples 14 with thermocouples being formed in the stacked arrangement on both sides of the layer of ECE material 110 in order to increase the voltage output of the device 100, as illustrated in the cross-sectional view of FIG. 3. Rather than forming the first electrode layer 104 and a second electrode layer 106 as continuous layer that extend across all or a majority of the device, the first electrode layer 104 is formed as a plurality of separate first electrode segments 104a, 104b, 104c, . . . , 104n, for n electrode segments. The second electrode layer 106 is then also formed as a plurality of separate second electrode segments 106a-106n over corresponding portions of the first electrode segments 104a-104n. The first and second electrode segments 104a-104n and 106a-106n comprise two different materials that display a good thermoelectric effect, i.e. have a substantial coefficient of voltage produced for a given temperature variation. By segmenting the thermocouple device 14 into segments, the device 100 advantageously generates an increased voltage output as each pair of thermocouple segments (e.g., 104a and 106a) outputs a voltage that is fed to the next thermocouple segment (e.g., 104b and 106b and so on) to create a thermopile.

The thermocouple 14 in this arrangement includes "stacked" layers of the thermocouple 14 are spread out over an area of the target substrate 102 with interconnections between each pair of segments 104a-106a to the next adjacent pair of segments 104b-106b and so on. In this manner, the pairs of segments 104n-106n are arranged in a side-by-side "head to toe" arrangement with one another in order to produce a flat and thin thermopile that holds many advantages over other types of thermopile arrangements where the layers of the thermopile are simply directly stacked on top of each other. For example, the flat and thin configuration allows for rapid heat transfer to and from the adjacent layers of the device 100.

As illustrated in FIG. 3, an additional thermocouple 14 comprising a thermopile of "stacked" pairs of electrode segments 104n-106n can also be formed on the opposite side of the layer of ECE material 110 in order to increase the voltage output of the device 100. A target substrate 114 (serving as an additional heat exchanger thermal source 12) is formed over the additional thermocouple 14, where the target substrate 114 is either a thermally conductive material or a thin insulated material that is formed on a thermally conductive surface. In one or more embodiments, insulation layers 116 may be formed between on both sides of the layer of ECE material 110 in between the pairs of electrode segments 104n-106n and respective metal layer 108 and 112.

In one or more embodiments, in order to apply the electric field through metal layers 108 and 112 and to collect the electrical energy produced by the thermocouples 14, a number of electrical connections are formed to the various layers of the device 100. Electrical connectors 1 and 2 are respectively connected to the layers 104 and 106 of the bottom thermocouple 14, while electrical connectors 5 and 6 are respectively connected to the layers 104 and 106 of the top thermocouple 14. Each of the electrical connectors 1, 2, 4 and 5 are further connected to the energy accumulator 28. Further, electrical connectors 3 and 6 are respectively connected to the metal layers 108 and 112, where electrical connectors 3 and 6 are also connected to the field generator 22 for generation of the electric field. A time-varying alternating electric field is then applied across the layer of ECE material 110, while the electric field is electrically isolated from the thermocouple layers 104 and 106. Alternatively, one or more of the layers of the electrode layers 108 and 112 could comprise one of the thermocouple layers 104 and 106, in which case such thermocouple layer 104 or 106 would not be electrically isolated from the electric field.

Figure 4:
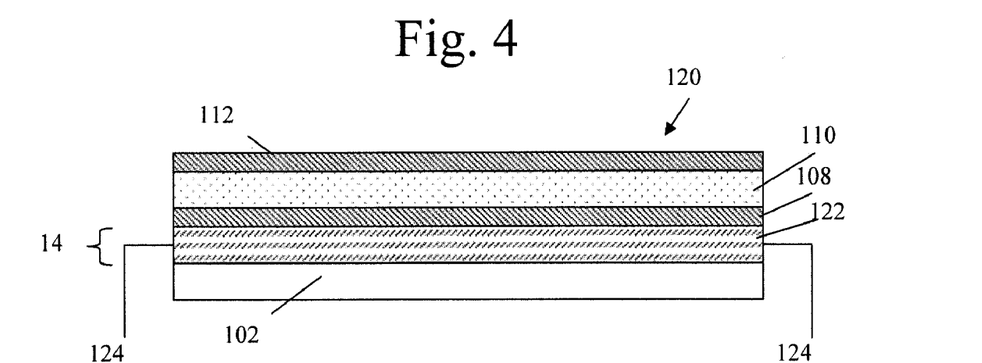
FIG. 4 illustrates a cross-sectional view of a thermal to electrical energy converting device exhibiting Thomson electrocaloric effects formed in accordance with one or more embodiments of the present disclosure.

It is understood that the thermal to electrical energy conversion component 14 may comprise a single thermocouple formed on one side of the ECE field-responsive material (as illustrated in FIG. 2), multiple thermocouples formed on the same or opposite sides of the ECE field-responsive material (as illustrated in FIG. 3), a plurality of "stacked" thermocouple devices on one or both sides of the ECE field-responsive material (as illustrated in FIG. 3), a single layer of ECE material exhibiting a Thomson effect (as illustrated in FIG. 4), or any combination of such arrangements or other thermal to electrical energy conversion arrangements.

Referring now to FIG. 4, in one or more embodiments, the ECE thermal to electrical energy converting device 120 may include a thermal to electrical energy conversion component 14 formed as a single layer of material 122 that exhibits a Thomson effect. The device 122 illustrated in FIG. 4 operates substantially the same as the device 100 described above in connection with FIGS. 2 and 3, except that the thermal to electrical energy conversion component 14 is formed as a single layer of material 122 that displays large Thomson coefficients instead of a two material thermocouple. The Thomson effect material 122 may comprise copper, nickel or other materials that display large Thomson coefficients. In this embodiment, the heating of the layer of ECE field-responsive material 110 material creates temperature differentials from one side of the layer of Thomson effect material 122 material to the other side, which induces a current flow in the electrical connectors 124 connected to the Thomson effect material 122. Each Thomson effect component 122 is connected in a "head to toe" fashion in series similar to the thermopile of FIG. 2, such that the voltage output by a small temperature rise can be substantial. Further, thermal equilibration of the Thomson effect material 122 takes place rapidly, and the device 120 may be cycled in a manner such that the current and voltage produced by the device 120 are removed from the device 120 through electrical connectors 124 synchronously during the alternating electric field cycling. A device exhibiting Thomson effects is advantageous in that that a single material can be used as the thermal to electrical energy conversion component 14, which simplifies the manufacturing process.

Figure 5:
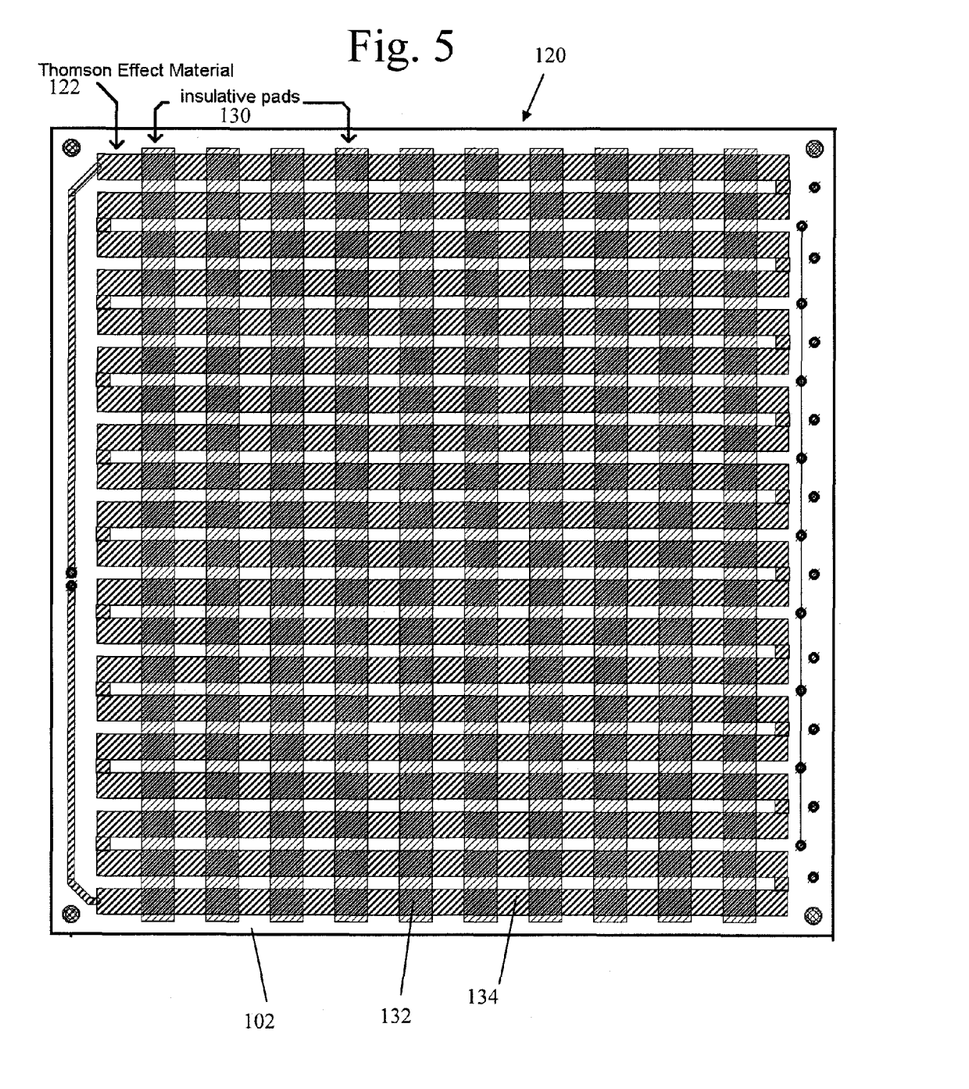
FIG. 5 illustrates a partial cutaway top view of a thermal to electrical energy converting device exhibiting Thomson electrocaloric effects formed in accordance with one or more embodiments of the present disclosure.

Referring now to FIG. 5, a partial cut away top view is illustrated of another embodiments of the ECE thermal to electrical energy converting device 120 which includes the thermal to electrical energy conversion component 14 formed as a Thomson effect material 122. In one or more embodiments, the Thomson effect material 122 is arranged in a serpentine fashion over the target substrate 102, where strips of insulation material 130 may be formed over spaced apart areas of the serpentine Thomson effect material 122 to create alternating areas that are either covered 132 or not covered 134 by the insulation material 130. This combination of serpentine Thomson effect material 122 and insulation material 130 serve to function as the thermal to electrical energy conversion component 14. In one or more embodiments, the Thomson effect material 122 under the alternating areas of insulation material 130 remain at a fairly constant temperature while "strips" of uncovered areas 134 are thermally cycled by the alternating field. The highly thermally conductive but electrically nonconductive metal layer 108 would then be formed over this formation of the thermal to electrical energy conversion component 14 and the remainder of the structure of the device would be formed similarly as in the other embodiments described herein.

In many of the various embodiments of the thermal to electrical energy converting device that is formed to exhibit an Electrocaloric effect (ECE), a variety of possible materials can be utilized for the different portions of the devices. In one or more embodiments, in the case of the thermocouple component being utilized as the thermal to electrical energy conversion component 14, the materials may be selected from copper, constantan (Cu/Ni alloy) or other materials exhibiting similar properties. The metals are evaporated onto the base substrates by thermal evaporation of the metal under vacuum using a tungsten filament in contact with an alumina crucible, wherein this thin film deposition technique is commonly known to those skilled in the art of making metal coatings.

In another embodiment, the thermocouples may be formed using a thick film process, commonly known as a screen process, where such "screen" processes are commonly known to those skilled in the art. One such screen process can be used with the same copper/constantan formula, but substantial difficulties are encountered when making the paste to be spread onto the base substrate. Buildup of oxide layers on the micrometers sized metal particles leads to substantial resistance in the resulting circuit. To prevent the build-up of oxide layers, two possible solutions can be employed. A first possible solution involves suspending the copper particles in rosin flux used for medium temperature soldering, heating the resulting paste (after screening) in order to create a reduction of the copper oxide (and other oxidation products of copper) on the surface of the copper. This increases the conductivity of the electrodes. The electrodes can then be rinsed with hexane to remove excess flux and dried prior to the screening of the next pad. A second possible solution to prevent the build-up of oxide layers involves suspending the copper particles in a dissolved matrix of a conductive polymer. This polymer can be synthesized "in situ" by mixing pyrrole with an alkylsulfonic acid or a polyaniline conductive polymer, where the addition of Ag nanoparticles or other silver particles to the resulting mix described above is then performed.

By way of example and without further limitation to other embodiments, one specific representative embodiment for forming a thermal to electrical energy converting device that exhibits an Electrocaloric effect (ECE) will now be set forth. Using a thermal conductive substrate 12, such as an nonconductive anodized Aluminum plate of approximately 6" by 6", a coating of copper can be applied to its surface in an area of approximately 5"×4". The thickness of the layer is preferred to be 3 to 10 micrometers in thickness. A method for forming the copper layer is by the thermal evaporation of copper in a vacuum. A copper lead is attached to this layer (or formed by the mask for screening or thermal evaporation plating) and attached to a copper lead to one lead of the electrical load for the circuit. On top of the copper layer thus formed is applied another layer of copper/nickel alloy (constantan). Thermal evaporation of this material under vacuum is performed such that the copper layer under the constantan layer is completely covered except for the lead to the electrical load. The thickness of the layer is preferred to be 3 to 10 micrometers in thickness. A constantan lead is attached to the newly formed top layer and thereafter attached to the remaining lead going to the electrical load. Another insulating layer is coated on the top of the constantan layer. This layer may be spin coated or carefully applied as an layer of shellac or other material that will provide a strong electrically insulating barrier. This layer should be as thermally conductive as possible, however. The thickness of the layer is preferred to be 1 to 10 micrometers in thickness. A thermal evaporation of a Nickel layer is then coated onto the shellac layer after drying. A lead is attached to this layer that is connected to the field generation electronic driver. To this layer is added a dilute solution of Rochelle salt and thiourea dissolved in ethanol (50:50) at a concentration of 1 g per 100 mL. After suitable drying at 25 degC, the layers are heated slowly over a period of 1 hr to 110 degC. Another layer of thin shellac may be applied as above and another similar coatings as described above of aluminum, shellac, constantan, and copper may then be applied as before in reverse order.

Figure 6:
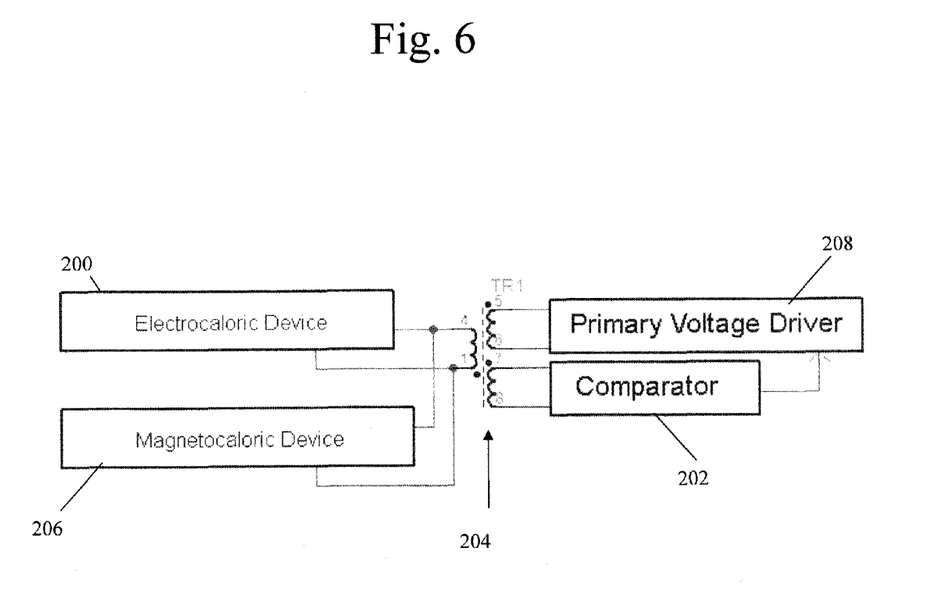
FIG. 6 illustrates a schematic circuit diagram of a thermal to electrical energy converting device formed in accordance with one or more embodiments of the present disclosure.

The resulting ECE device 200 or any other thermal to electrical energy converting device that exhibits an Electrocaloric effect (ECE) may be arranged in the circuit arrangement as illustrated in FIG. 6. In one or more embodiments, operation of the ECE device 200 is accomplished by the comparator 202 slowly driving the primary electronic coil of a transformer 204 into oscillations from the secondary coil. When the proper oscillation frequency is selected or otherwise determined (which is dependent on the capacitance of the device and the parallel inductors), then the comparator 202 will only drive the primary coil of the transformer 204 when oscillations drop below a certain predefined level. The output of the thermocouple(s) in the ECE device 200 will then be found to produce voltage and current at frequencies that correspond to the resonance frequency of the field generator. In one or more embodiments, the field generator in this embodiment includes the capacitive plates of the ECE device 200 and/or the coil of the MCE device 206 that are both attached to the secondary of the transformer 204, where the transformer 204 provides a manner of starting resonance of the system. Suitable parallel and series connection of ECE devices 200 or by connection of a multitude of the devices 200 by external connections will result in an voltage and current waveforms that are suitable for further modification by well recognized electronic control means for one normally trained in the field of power management.

Magnetocaloric Devices Employing Magnetocaloric Effects

In one or more embodiments, a thermal to electrical energy converting device is provided including at least one Magnetocaloric device employing a MCE material. A magnetocaloric material is utilized that displays a heating or cooling in temperature when the material is subjected to a magnetic field. The reverse of the temperature effect is observed when the MCE material is removed from the field. Due to the nature of the magnetic field, the strongest magnetic fields can be produced when the electrodes used to form them are situated in circular or tubular arrangements, such as a solenoid coil. However, it is understood that a thermal to electrical energy converting device including a magnetocaloric material that exhibits a MCE can be formed to possess formations that not circular or tubular arrangements, such as being formed to be flat and thin, especially when the devices are formed to be small.

Figure 7:
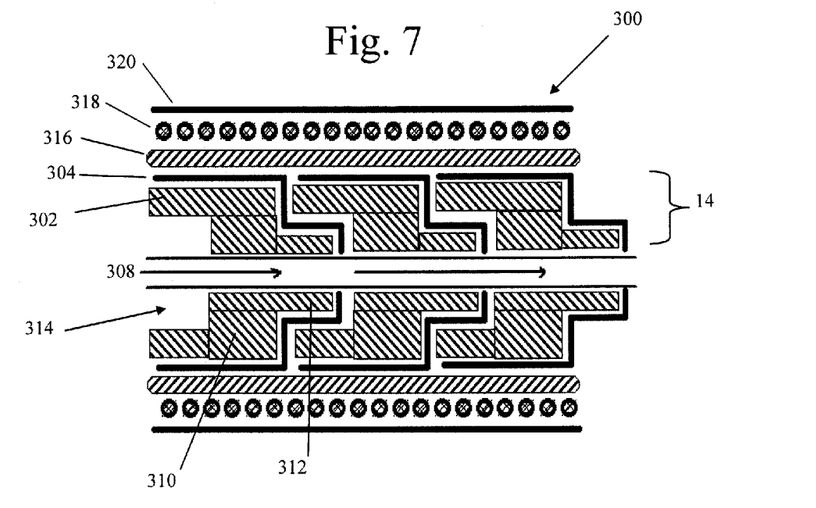
FIG. 7 illustrates a cross-sectional view of a thermal to electrical energy converting device exhibiting magnetocaloric effects formed in accordance with one or more embodiments of the present disclosure.

Referring now to FIG. 7, a cross-sectional view of one example of a MCE thermal to electrical energy converting device 300 is illustrated in accordance with one or more embodiments. The device 300 includes a thermal to electrical energy conversion component 14 comprising at least one first thermocouple portion 302 possessing a tubular, cylindrical or circular shape, and a corresponding second thermocouple portion 304 that is formed adjacent to and over the surface of the first thermocouple portion 302 so as to conform to the shape of the first thermocouple portion 302. In one or more embodiments, the first thermocouple portion 302 possesses a tubular shape with an inner diameter that is formed over an inner layer 306 of binding material that is used to electrically isolate and bind the tubular structure together, wherein the inner diameter of the first thermocouple portion 302 extends around a flow channel 308 that allows a flow of liquid or gaseous material through the center of the device 300 to provide heat transfer (e.g., similar to functionality of the heat exchanger thermal source 12). The first thermocouple portion 302 further possesses a back section 310 having a larger diameter and a front section 312 having a smaller diameter. A cavity 314 may be formed in the center of the back section 310, such that the cavity 314 possesses a diameter larger than the combination of the diameter of front section 312 and the thickness of the second thermocouple portion 304. This formation allows a plurality of pairs of first and second thermocouple portions 302 and 304 to be situated in a "nested" or "stacked" arrangement, as illustrated in FIG. 7 with portions from one pair extending into another pair, to increase the voltage output of the device 300.

A layer of magnetocaloric material 316 exhibiting MCE is formed around the outside of the tubular thermocouple 14, and windings of an electrical wire 318 (e.g., solenoid) or printed circuit are formed around the MCE material 316 and further connected to the field generator 22 for subjecting the MCE material 316 to an alternating magnetic field. In one or more embodiments, an optional outer layer of protective material 320 may be formed around the electrical windings 318 to limit heat loss and/or provide a protective film. The magnetic field is varied in a time dependent manner to provide "pulses" of thermal differentials to the MCE material 316 and, in turn, the tubular thermocouples 14, which are then converted into electrical energy. Electrical connections are connected to respective portions of the thermocouples 14 so as to capture the electrical flow from the thermocouples 14 and collect it in the energy capturing component 28.

In one or more embodiments, the thermocouple 14 illustrated in FIG. 7 is a linear array thermopile formed in a unique fashion by stacking of several uniquely shaped individual thermocouples comprising a first thermocouple portion 302 and second thermocouple portion 304 pair into each other. Each of the pairs of thermocouple portions 302 and 304 are electrically attached to each other in a "head to toe" configuration in order to provides a higher voltage output from the device 300. It is understood that the thermocouple 14 can be formed to possess a differently-shaped thermopile nested arrangement or can be formed as a single thermocouple extending throughout the device. Further, a multitude of single individual devices could be used in parallel to provide the same characteristics as the linear stacked thermocouple described above.

Figures 8A, 8B:
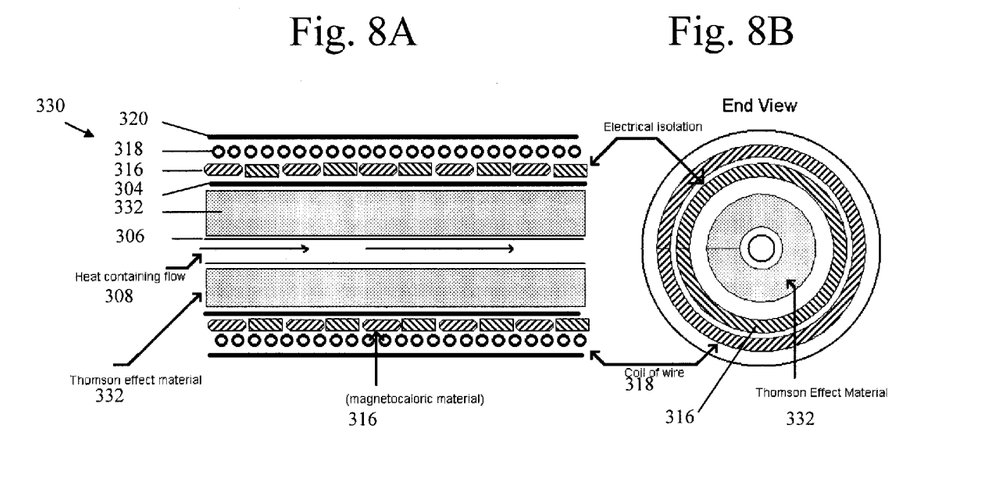
FIG. 8A illustrates a cross-sectional side view of a thermal to electrical energy converting device exhibiting magnetocaloric effects formed in accordance with one or more embodiments of the present disclosure.
FIG. 8B is a cross-sectional end view of the thermal to electrical energy converting device of FIG. 8A.

In one or more embodiments, the MCE thermal to electrical energy converting device 330 may include a thermal to electrical energy conversion component 14 formed as a single layer of material 332 that exhibits a Thomson effect, as illustrated in the cross-sectional views of FIGS. 8A and 8B. The MCE device 330 exhibiting a Thomson effect is otherwise substantially formed and operating similar to as described above in connection with FIG. 7.

In one or more embodiments, the driving electronics for the MCE device 204 (representing MCE device 300, 330 or any other embodiment for a MCE device) are illustrated with reference back to FIG. 6, where connection to the electronics is made through either end of the tube arrangement. With a time varying magnetic field, a current can be produced through the tubular device 204 that is substantial in nature. In one or more embodiments, the primary voltage driver 206 of the magnetic field can be simply described as a "Tank circuit" comprised of inductors and capacitors. In this arrangement, the circuit for the primary voltage driver 206 is activated by initiation of the current flow through an inductor and through the coil 318 of the MCE device 204. This current creates a magnetic field that initiates the heating or cooling of the magnetocaloric material. When the magnetic field is fully formed and ready for discharge, the current supply is then turned off and the magnetic field is allowed to collapse. If there are no other "close coupled" inductive coils in the vicinity of the collapsing magnetic field, the back emf inducted into the coil 318 is then drained into a capacitor as accumulated charge. The voltage thus induced is dependent upon the energy storage in the magnetic field and the size of the capacitor.

In one or more embodiments, a thermal to electrical energy converting device and method may be formed that utilizes at least one of and possibly both of magnetocaloric effect and electrocaloric effect materials. In one or more embodiments, a device utilizing both magnetocaloric and electrocaloric effects could be formed to "share" a circuit to take advantage of both the capacitive nature of the ECE materials and the inductive nature of the MCE materials. In the circuit illustrated in FIG. 6, the ECE device 200 is used as the capacitive element of the tank circuit and the MCE device 206 device is used as the inductive element. The primary side of the transformer 204 is comprised of two separated coils. One of the primary coils is driven by the primary voltage driver 208 power circuit to supply the initial power to activate the oscillations of the secondary coil and the devices 200 and 206. The second primary coil is a sense element that is connected via appropriate conditioning electronics to a comparator circuit 202. As the decay of the oscillations take place, the comparator 202 activates the primary in an appropriate fashion to "pump" more charge into the secondary circuit to maintain the oscillations. The period of the oscillations is chosen to be such that the LC resonant circuit has a very low reactance such that the power used to create and remove the fields in each device is very low. The exact amount of power consumed by the thermal to electrical energy converting devices is typically very low, such that each oscillation of the circuit is usually more than 95% efficient. However, depending upon the efficiency of the heat to electrical conversion and the resistance of the device capacitive plates and coils, this efficiency may be lower and the device will still work with desirable electrical wattage output per heat unit input.

By way of example and without further limitation to other embodiments, one specific representative embodiment for forming a thermal to electrical energy converting device that exhibits a Magnetocaloric effect (MCE) will now be set forth. Using a thermal conductive substrate 12, such as a piece of copper pipe ¼" in diameter with a wall thickness of 3/32", a coating of nickel can be applied to its surface in an length of approximately 4". The thickness of the layer is may be selected to be 3 to 10 micrometers in thickness. A method for forming the nickel layer is by electroless deposition of the nickel onto the copper. A copper lead is attached to this layer (or formed by the mask for screening or thermal evaporation plating) and attached to a copper lead to one lead of the electrical load for the circuit. A nickel lead is attached to the newly formed top nickel layer and thereafter attached to the remaining lead going to the electrical load. Another insulative layer is coated on the top of the nickel layer. This layer may be spin coated or carefully applied as an layer of shellac or other material that will provide a strong electrically insulative barrier. This layer should be as thermally conductive as possible, however. The thickness of the layer is preferred to be 1 to 10 micrometers in thickness. To this outer circular diameter is added a dilute solution of Rochelle salt and thiourea dissolved in ethanol (50:50) at a concentration of 1 g per 100 mL to form a layer that is approximately 10 to 50 microns in thickness. After suitable drying at 25 degC, the layers are heated slowly over a period of 1 hr to 110 degC. Another layer of thin shellac may be applied as above maintain structural strength. A coil of magnet wire (30 AWG) is wound onto the length of the copper tube for approximately 4". Each end of the copper coil is then attached to the current driver from the field electronic generator. Operation of the MCE device is by the comparator 202 slowly driving the primary electronic coil into oscillations from the secondary. When the proper oscillation frequency is found (which is dependent on the capacitance of the device and the parallel inductors), then the comparator 202 will only drive the primary when oscillations drop below a certain predefined level. In one or more embodiments, the frequency of the field's actuation may be selected depending upon the size and capacities of the various electrical and heated material sizes. For example, substantially lower frequencies could be used with more massive devices while achieving good effects.

In one or more embodiments, a thermal to electrical energy converting device and method are provided that do not require a high voltage electronic capacitor for the circuits. The present device and method provide an improved efficiency in the process of converting thermal energy to electrical energy by not having a separate thermodynamic process that requires a "cold sink." Since the heat from the ambient environment of a transducer is converted into energy "directly" (direct in so far as an external observer is concerned), there is no heat loss connected with the transformation itself. There may be heat loss from other sources such as insulation loss from the heat source to the environment, but insofar as the conversion is concerned, there is little (radiation) if any heat loss in the process. It is the nature of the field-responsive material that allows for the elimination of a separate cold sink. When the field-responsive material is subjected to a field, it enters into an electronic population that has an inverted state. That is, the dipoles of the field-responsive material have an anti-entropic alignment with the field. So, when the field is removed, a cooling of the field-responsive material takes place, as well as an increase in entropy. Taking the total thermal environment and the utilization of the electrical energy into account also shows that the process results in an overall increase in entropy and is thereby a natural process cycle. Another advantage achieved by the present device and method is that electrical energy is produced in the form of an AC electrical current. In this manner, electrical energy is generated in a "high quality" form of energy that is relatively easily utilized and transported. As such, the ability to transform a "low grade" of heat into a high grade of energy is achieved.

A thermal to electrical energy converting device formed in accordance with one or more embodiments described herein further provides a device that can produce more energy than the energy required to make the device itself. Due to the non-moving nature of the technology, the materials and circuits will not normally "wear out" in any period of time that is less than the energy producing time of the device, thereby requiring little to no maintenance of the device. The device is capable of being formed in a compact arrangement, thus aiding in its low demand of energy for manufacture. The circuitry materials used to operate the device can be operated within known guidelines for most common technologies commonly found in households. It is also possible to recycling the material used in the device since none of the materials are known to be radioactive or have highly toxic natures.

In one or more embodiments, the ratio of electrical power consumed by the thermal to electrical energy converting device is less than the amount of power produced by the device. Further, the amount of electrical power produced by the thermal to electrical energy converting device is greater than the amount of power produced by the device were it not to possess the field-responsive material.

It should be noted that the thermal to electrical energy converting device and method could be utilized in a variety of possible different types of situations where thermal energy could be converted into electrical energy, including but not limited to transportation (e.g., automobiles burning gasoline to produce heat to power the heat needed for the device, larger transportation devices such as ships, utilization for lighting such as vehicle lighting, utilization for aircraft where the ambient air is used as a heat source, additional heating from the combustion of fuel, etc.), processing materials (e.g., steel, copper, aluminum, etc.) and electrical uses such as in the processing of aluminum and other ores, hand held electronic devices (e.g., portable computers, analysis equipment, remote sensing equipment, etc.), industrial and/or household appliances (e.g., air conditioning, water heating, space heating, furnaces, refrigerators, basic lighting, dishwashers, microwave ovens, televisions, washers and Dryers, etc.), devices utilizing an electrical motor (e.g., agricultural machines, scooters, bicycles, etc.), battery operated devices (e.g., flashlights, cameras, CD players, batteries in vehicles, cellular phones, watches, clocks, etc.), ocean-going vessels or vessels used for Maritime use, or any other possible use in which thermal energy can be converted into electrical energy in accordance with the present teachings.

While the system and method have been described in terms of what are presently considered to be specific embodiments, the disclosure need not be limited to the disclosed embodiments. It is intended to cover various modifications and similar arrangements included within the spirit and scope of the claims, the scope of which should be accorded the broadest interpretation so as to encompass all such modifications and similar structures. The present disclosure includes any and all embodiments of the following claims.

What I claim:

1. A thermal-to-electrical energy conversion method, comprising:
   (a) subjecting a field-responsive material including a magnetocaloric material to a magnetic field to induce a temperature change in the field-responsive material;
   (b) creating a temperature change in at least one thermal to electrical energy conversion component in thermal contact with the field-responsive material based on the temperature change in the field-responsive material;
   (c) creating electrical energy in the at least one thermal to electrical energy conversion component based upon the temperature change experienced by the thermal to electrical energy conversion component and outputting the electrical energy created;
   (d) removing the field from the field-responsive material to allow the field-responsive material and the at least one thermal to electrical energy conversion component to approach thermal equilibrium;
   (e) repeating steps (a)-(d) to repeatedly create and output electrical energy.

2. The method of claim 1, further comprising applying a time-varying alternating field as the magnetic field.

3. The method of claim 1, further comprising:
   creating electrical energy in the form of an AC electrical current;
   storing the AC electrical current in an energy capture component that captures electrical flow from the at least one thermal to electrical energy conversion component.

4. The method of claim 1, further comprising:
   creating a temperature change in a plurality of thermal to electrical energy conversion components that are in thermal contact with the field-responsive material based on the temperature change in the field-responsive material;
   creating electrical energy in the plurality of thermal to electrical energy conversion components based upon the temperature change experienced by the thermal to electrical energy conversion component and outputting the electrical energy created;

removing the field from the field-responsive material to allow the field-responsive material and the plurality of thermal to electrical energy conversion components to approach thermal equilibrium.

5. The method of claim 4, wherein the plurality of thermal to electrical energy conversion components include thermal to electrical energy conversion components that are respectively adjacent to different portions of the field-responsive material.

6. The method of claim 4, wherein the plurality of thermal to electrical energy conversion components include thermal to electrical energy conversion components that are interconnected together in a stacked head-to-toe relationship such that the electrical energy output by each thermal to electrical energy conversion component is combined together to produce a combined electrical energy output.

7. The method of claim 1, further comprising assisting in the achievement of thermal equilibrium by allowing thermal energy to pass from a heat exchanger in thermal contact with the thermal to electrical energy conversion component to pass through to the field-responsive material.

8. The method of claim 1, wherein the thermal to electrical energy conversion component includes at least one of a thermocouple material, a Thomson effect material and a pyroelectric material.

9. The method of claim 1, further comprising generating the at least one of an electrical and magnetic field with a resonant circuit having at least 75% efficiency per cycle.

10. The method of claim 1, wherein the electrical energy created and output by the at least one thermal to electrical energy conversion component is greater than the electrical energy required to produce the magnetic field.

11. The method of claim 1, further operating a comparator circuit to governs additional power necessary for the generation of a time-varying alternating field using feedback received from the device.

* * * * *